United States Patent
Nose (10) Patent No.: US 6,707,158 B2
(45) Date of Patent: Mar. 16, 2004

(54) SEMICONDUCTOR DEVICE AND METHOD FOR PRODUCING THE SAME, AND ANISOTROPIC CONDUCTIVE CIRCUIT BOARD

(75) Inventor: Sachiyuki Nose, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 165 days.

(21) Appl. No.: 10/095,579

(22) Filed: Mar. 13, 2002

(65) Prior Publication Data

US 2002/0132450 A1 Sep. 19, 2002

(30) Foreign Application Priority Data

Mar. 14, 2001 (JP) ........................................ 2001-072214

(51) Int. Cl.$^7$ .......................... H01L 23/48; H01L 23/52; H01L 29/40
(52) U.S. Cl. ........................................ 257/777; 257/787
(58) Field of Search ................................ 257/666, 676, 257/678, 777, 778, 787

(56) References Cited

U.S. PATENT DOCUMENTS 5,068,712 A * 11/1991 Murakami et al. ............ 357/72
6,326,681 B1 * 12/2001 Murakami et al. .......... 257/676

* cited by examiner

Primary Examiner—David Nhu
(74) Attorney, Agent, or Firm—Nixon Peabody LLP; Donald R. Studebaker

(57) ABSTRACT

A semiconductor device includes a circuit board, a semiconductor element that is mounted on an upper surface of the circuit board and has an electrode terminal, and a sealing resin for sealing a periphery of the semiconductor element that is mounted on the upper surface of the circuit board. The circuit board includes a plurality of conductive members and an insulating substance for binding and fixing the plurality of conductive members. Each of the plurality of conductive members includes a conductive material formed integrally from the upper surface through the lower surface of the circuit board, and an insulating material covering an outer circumference of the conductive material. The conductive material of at least one conductive member of the plurality of conductive members is exposed to the upper surface of the circuit board. The electrode terminal of the semiconductor element is electrically connected to the conductive material of the conductive member exposed to the upper surface of the circuit board via a connecting member.

10 Claims, 5 Drawing Sheets

FIG. 1A (i) (ii) (iii) (iv)

FIG. 1B (i) (ii) (iii) (iv)

SEMICONDUCTOR DEVICE AND METHOD FOR PRODUCING THE SAME, AND ANISOTROPIC CONDUCTIVE CIRCUIT BOARD

BACKGROUND OF THE INVENTION

1. Field of the Invention

The present invention relates to a semiconductor device and a method for producing the same, and an anisotropic conductive circuit board. In particular, the present invention relates to a semiconductor device employing a circuit board including a bonding pad portion on which a semiconductor element is to be mounted on its upper surface and electrode pads connected to electrode terminals of the semiconductor element via a connecting member, and a method for producing such a semiconductor device, and relates to a semiconductor device having good electrical and thermal characteristics and a method for producing such a semiconductor device.

2. Description of Related Art

Hereinafter, a semiconductor device employing a commonly used printed circuit board used as a component of a semiconductor package will be described.

Figure 8A:
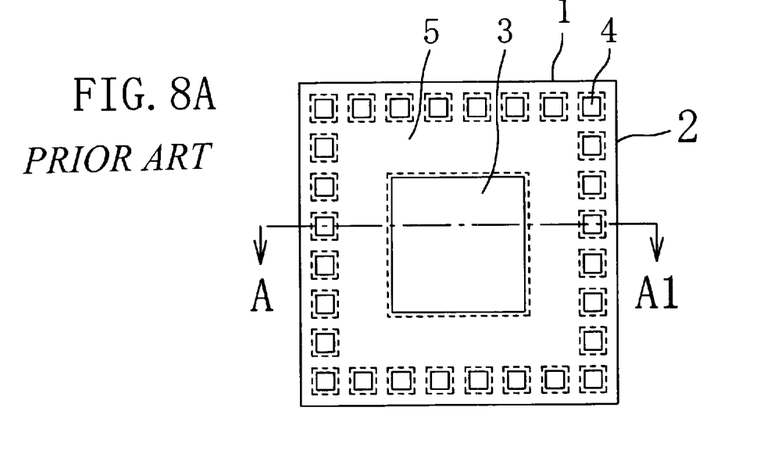
FIGS. 8A to 8E are views illustrating a method for producing a conventional semiconductor device.

FIGS. 8A to 8E are views illustrating the production process of a conventional LGA (lard grid array) type semiconductor device in the order of the production. FIG. 8A is a plan view, FIGS. 8B to 8E are cross-sectional views of a relevant part taken along line A-A1 of FIG. 8A.

First, to produce a printed circuit board as shown in FIG. 8A, an insulating substrate 2 to which copper foils having a thickness of 6 to 35 μm are attached to its upper and lower surfaces is prepared. This insulating substrate 2 is a substrate in which glass fabrics have been incorporated into an epoxy resin.

Next, via holes are formed having a predetermine diameter in predetermined positions of the insulating substrate with a drill or a laser. Then, thick copper films are formed on the side walls of the formed via holes by electroless plating or electrolytic plating. At this point, the copper foils on the upper and the lower surfaces of the insulating substrate are connected by the thick copper films.

Next, dry films are attached onto the surfaces of the copper foils on the upper and the lower surfaces of the insulating substrate by heating and pressing. The dry films are made of a material that causes a reaction with respect to light having a specific wavelength, and the surfaces of the dry films are irradiated with light having a wavelength for a reaction via a photomask on which a predetermined circuit pattern has been formed. Thereafter, in the circuit pattern formed on the dry films on the copper foil surface on the upper and the lower surfaces of the insulating substrate, the portions to be removed of the dry films are dissolved with a developer and removed after exposure to the light. Then, after the removal, the dry films are heated or irradiated with ultraviolet rays so that the remaining portions of the dry films are cured. Using these dry films as masks, exposed copper film portion is removed by allowing the copper foil erosion chemicals such as nitric acid, sulfuric acid or hydrochloric acid to be in contact with the surface of the copper foils, for example, by dipping or spraying.

Finally, the dry films that have been exposed to the chemicals and cured are removed by using a detaching agent, dissolving it in oxygen plasma, or converting it to carbon dioxide. Solder resist films are formed on the upper and the lower surfaces of the thus obtained printed circuit board 1 by screen printing, and the pattern is formed on the solder resist film via a photomask by an exposure machine. Then, the portion to be dissolved of the solder resist film is dissolved with a developer and removed, and then heated and cured. Then, nickel and gold are deposited in this order in predetermined thicknesses by electrolytic plating on the surface of the copper foil portion corresponding to the opening of the pattern from which the solder resist film is removed. Thereafter, the printed circuit board is divided so as to form a frame shape or divided into individual segments by stamping with a pressing machine or a cutting machine.

The printed circuit board 1 for use in a conventional board structure package, which includes bonding pads, electrode pads, and through-holes connecting the bonding pads and the electrode pads on the upper surface to those on the lower surface, has been produced in this manner.

As shown in FIG. 8A, on each of the upper and the lower surfaces of the insulating substrate 2, the produced printed circuit board 1 includes a bonding pad 3, electrode pads 4 and through-holes 6 connecting the pads 3 and 4 on the upper surface to the corresponding pads on the lower surface. The surface of each of the pads on the printed circuit board 1 is coated with a thin film made of gold or silver. The bonding pad 3 consists of the upper bonding pad and the lower bonding pad, and the electrode pad 4 consists of the upper electrode pad and the lower electrode pad. A solder resist film 5 is formed on the substrate in such a manner that the pads 3 and 4 are exposed.

Next, referring to 8A to 8E, a method for producing a semiconductor device (for a LGA type package) including the printed circuit board 1 will be described below.

Figure 8B:
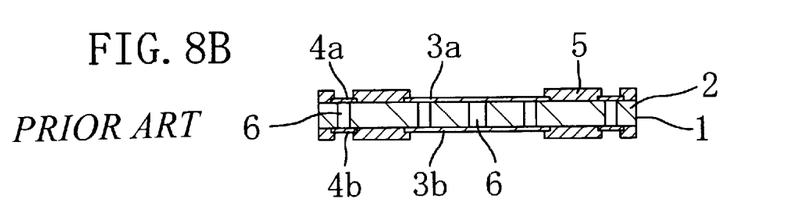

First, the circuit board 1 as shown in FIG. 8A is prepared. In the prepared circuit board 1, as shown in FIG. 8B, an upper bonding pad 3a, a lower bonding pad 3b, upper electrode pads 4a, and lower electrode pads 4b are formed on an insulating substrate 2, and through-holes 6 for connecting the bonding pads 3a and 3b and the electrode pads 4a and 4b on the upper surface of the substrate to the corresponding pads on the lower surface are provided.

Figure 8C:
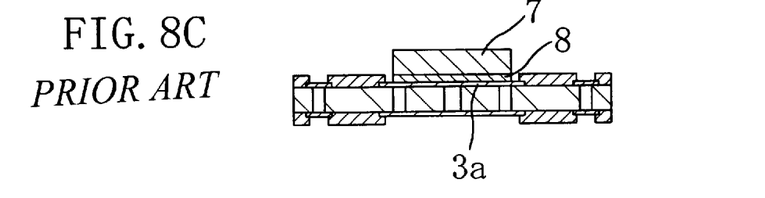

Then, as shown in FIG. 8C, a die bonding process is performed, in which a semiconductor element 7 is attached onto the upper bonding pad 3a with a conductive adhesive 8 such as silver paste, and then heating is performed at 150° C. for one hour in the air for strong adhesion.

Figures 8D, 8E:
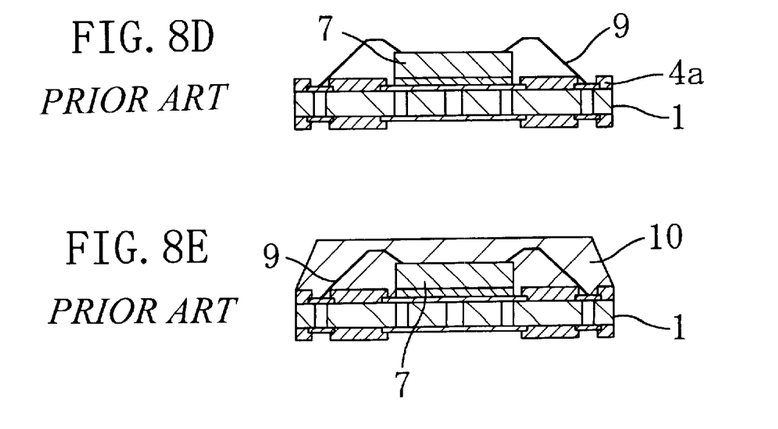

Then, as shown in FIG. 8D, a wire bonding process is performed, in which electrode terminals (not shown) on the semiconductor element 7 mounted on the substrate are connected to the upper electrode pads 4a with connecting members 9 such as metal fine lines (wires) using a wire bonder. This connection is performed under the following conditions: The heating temperature of the printed circuit board 1 is 200° C., the load for connection between the connecting members 9 and the electrode terminals of the semiconductor element 7 is 20 gf, and the load for connection between the connecting members 9 and the upper electrode pads 4a on the printed circuit board 1 is 100 gf. This connection is performed using ultrasonic vibration as well.

Next, as shown in FIG. 8E, an outline molding process is performed, in which a sealing resin 10 is molded to a predetermined package outline with a transfer mold or a print sealing so that the semiconductor element 7 and the connecting members 9 provided on the upper surface of the printed circuit board 1 are sealed and formed into one piece.

In this manner, a semiconductor device for an LGA type package including a conventionally commonly used printed circuit board as a component is produced. Furthermore, if metal ball terminals are provided on the lower electrode pads 4b (land portions) on the bottom surface of the printed circuit board 1, a BGA (ball grid array) type semiconductor package can be achieved.

However, the conventional semiconductor device has the following problems. In the conventional printed circuit board type package including a glass epoxy substrate, the connection between the upper electrode pads and the lower electrode pads or the connection between the upper bonding pad and the lower bonding pad are established via the via holes, so that variations in the structure of the via holes or the plating thickness in the via holes may cause variations in the electrical resistance or the inductance of the wiring portions. Furthermore, since the substrate material is an organic substance, a dielectric constant of the printed circuit board is large, so that it is not suitable to a semiconductor package that requires a high frequency performance. In addition to this problem, there is also an electricity and moisture resistance-related problem in that a water content enters the inside from the outside via the via holes and corrodes the copper foil layer in the upper electrode pad portion of the printed circuit board to which the connecting members such as wire are connected.

Furthermore, the printed circuit board is made of glass epoxy, so that this is insulative with respect to thermal conduction. This causes a heat-related problem as well. More specifically, when a semiconductor element having high power consumption is mounted on the printed circuit board, heat is not released sufficiently, so that the temperature increases in the principal surface on which an integrated circuit is formed in the semiconductor element. As a result, the temperature in the principal surface exceeds the allowable temperature, which leads to malfunction of the circuit.

SUMMARY OF THE INVENTION

Therefore, with the foregoing in mind, it is a main object of the present invention to provide a semiconductor device employing a circuit board that has good electrical and thermal characteristics and a method for producing such a semiconductor device.

A semiconductor device of the present invention includes a circuit board; a semiconductor element that is mounted on an upper surface of the circuit board and has an electrode terminal; and a sealing resin for sealing a periphery of the semiconductor element that is mounted on the upper surface of the circuit board. The circuit board includes a plurality of conductive members and an insulating substance for binding and fixing the plurality of conductive members to each other. Each of the plurality of conductive members includes a conductive material formed integrally from the upper surface through the lower surface of the circuit board, and an insulating material covering an outer circumference of the conductive material. The conductive material of at least one conductive member of the plurality of conductive members is exposed to the upper surface of the circuit board. The electrode terminal of the semiconductor element is electrically connected to the conductive material of the conductive member exposed to the upper surface of the circuit board via a connecting member.

In one embodiment of the present invention, a bonding pad made of a metal coating film connected to the conductive material of a part of the plurality of conductive members, and an electrode pad connected to the conductive material of a part of the plurality of conductive members are provided on the upper surface of the circuit board. The semiconductor element is mounted on the bonding pad. The electrode terminal of the semiconductor element is connected to the electrode pad via the connecting member. A lower electrode pad corresponding to the electrode pad on the upper surface is provided on a lower surface of the circuit board. The lower electrode pad is connected to the conductive material of the conductive member connected to the electrode pad provided on the upper surface.

It is preferable that the conductive material of at least one conductive member of the plurality of conductive members is exposed to the lower surface of the circuit board, and a ball electrode or a protruding electrode is connected to the conductive material of the conductive member exposed to the lower surface of the circuit board.

In one embodiment of the present invention, the conductive material is a fine line-like conductive material.

In one embodiment of the present invention, the conductive material has a cross-sectional shape of a circle or a polygon.

In one embodiment of the present invention, the conductive member and the insulating substance are exposed alternately to a side surface of the circuit board.

It is preferable that the circuit board is an anisotropic conductive circuit board that has electrical conductivity with respect to the upper and the lower surfaces and is electrically insulated in a horizontal direction.

In one embodiment of the present invention, a shape of the circuit board viewed from the upper surface thereof is any one of a circle, a rectangle, a hexagon and an octagon.

In one embodiment of the present invention, the connecting member is a conductive metal fine line or a metal ribbon.

In one embodiment of the present invention, the connecting member is a conductive protruding electrode.

A method for producing a semiconductor device of the present invention includes the steps of: (a) bundling and arranging a plurality of conductive members, each of which includes fine line-like conductive materials whose outer circumference is covered with an insulating material to form a conductive member cluster; (b) attaching and fixing the conductive members constituting the conductive member cluster to each other with an insulative resin to form a rectangular solid substrate block; (c) slicing the substrate block with a predetermined thickness to form a substrate element in which cross-sections of the plurality of conductive materials and the insulating materials covering the outer circumferences of the corresponding conductive materials are arranged and whose periphery is made of the insulating resin and the plurality of conductive members; (d) forming metal coating films on an upper surface and a lower surface of the substrate element, thereby forming a circuit board; (e) mounting a semiconductor element having an electrode terminal on an upper surface of the circuit board; (f) electrically connecting the electrode terminal of the semiconductor element mounted on the circuit board and the conductive material positioned on the upper substrate of the circuit board with a connecting member; and (g) sealing a periphery of the semiconductor element mounted on the upper surface of the circuit board and the connecting member with a sealing resin.

In one embodiment of the present invention, in the step (C), slicing is performed at an angle between 30° to 150° with respect to the longitudinal direction of the conductive member cluster constituting the substrate block such that a thickness becomes 0.05 mm to 3.00 mm.

It is preferable that the method for producing a semiconductor device further includes performing surface-processing by polishing both surfaces of the sliced substrate element, after the step (c).

In one embodiment of the present invention, the step (d) includes forming a metal coating film in a portion on the upper surface of the substrate element on which the semiconductor element is to be mounted to form a bonding pad portion; forming a metal coating film as an electrode pad connected to the conductive material of the substrate element in a portion of the upper surface of the substrate element to which a connecting member for electrically connecting to the electrode terminal of the semiconductor element to be mounted is to be connected, and forming a metal coating film on the conductive material exposed on the lower surface of the substrate element to form an electrode pad.

It is preferable that in the step (a), a plurality of conductive members are bundled and arranged in a plurality of rows such that they are densely filled in a grid or staggered manner in cross-section.

In one embodiment of the present invention, in the step (f), the connection is performed using a conductive metal fine line as the connecting member.

In one embodiment of the present invention, in the step (f), the connection is performed using a conductive protruding electrode as the connecting member.

In one embodiment of the present invention, the method for producing a semiconductor device further includes forming a ball electrode or a protruding electrode on an electrode pad on the conductive material exposed on the lower surface of the circuit board, after the step (g).

In one embodiment of the present invention, in the step (a), the conductive material is a metal fine line made of at least one selected from the group consisting of copper, a copper alloy, aluminum, an aluminum alloy, nickel, and a nickel alloy.

A circuit board of the present invention includes a plurality of conductive member; an insulating substance for binding and fixing the plurality of conductive members to each other; wherein each of the plurality of conductive members include a conductive material formed integrally from one end through the other end and an insulating material for covering an outer circumference of the conductive material, and there is a difference in conductivity between a direction to which the conductive material extends and directions other than that.

According to the present invention, a semiconductor element is mounted on the upper surface of a circuit board obtained by binding and fixing a plurality of conductive members, each of which includes a conductive material formed integrally from the upper surface through the lower surface of the circuit board, using an insulative substance. Therefore, the electrical resistance and the inductance between the upper and the lower surfaces of the board are significantly small, so that an electrically and thermally excellent semiconductor device can be achieved.

DETAILED DESCRIPTION OF THE INVENTION

Hereinafter, embodiments of the present invention will be described with reference of the accompanying drawings. In the following drawings, for the sake of simplification of description, the components having substantially the same function bear the same numbers. The present invention is not limited to the following embodiments.

Embodiment 1

First, an embodiment of a circuit board included in a semiconductor device of Embodiment 1 of the present invention will be described.

In the circuit board of this embodiment, a plurality of conductive members, each of which include a conductive material integrally formed from one end through the other end and an insulating material covering the outer circumference of the conductive material, are bundled and arranged, and attached and fixed to each other with an insulative substance, and this circuit board is an anisotropic conductive circuit board having a difference in the conductivity between the direction to which the conductive material is extending and the other directions. In other words, the circuit board of this embodiment is an anisotropic conductive circuit board that includes a plurality of conductive members, each of which includes a conductive material formed integrally from the upper surface through the lower surface and covered with an insulating material in its outer circumference, and an insulative resin for binding and fixing the plurality of conductive members. The anisotropic conductive circuit board is provided with electrode pads and at least one bonding pad on the surface of the conductive material of the conductive member exposed to its upper surface.

FIGS. 1A to 1G are views illustrating a method for producing the anisotropic conductive circuit board of this embodiment.

Figures 1A, 1B, 1C, 1D, 1E, 1F, 1G:
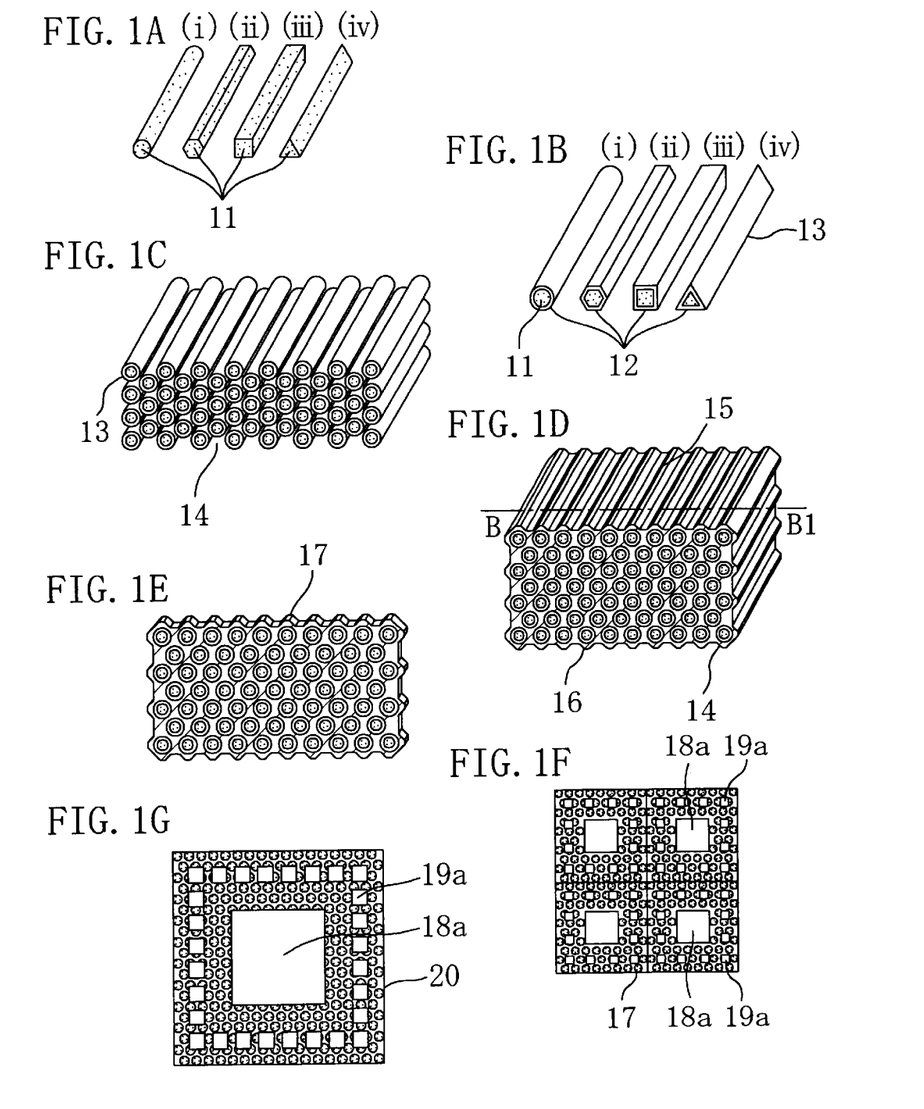
FIGS. 1A to 1G are views illustrating a method for producing an anisotropic conductive circuit board used in a semiconductor device of Embodiment 1 of the present invention.

First, as shown in a perspective partial view of FIG. 1A, a conductive material 11 that is a component of the circuit board is prepared. The conductive material 11 is made of a conductive metal such as copper (Cu), a copper alloy, aluminum (Al), an aluminum alloy, nickel (Ni), a nickel alloy, or gold (Au). In this embodiment, as shown in FIG. 1A, the conductive material 11 is a wire (metal fine line) having a cross-sectional shape of a circle (i) or a polygon (hexagon (ii), rectangle (iii), triangle (iv), etc.), and made of a material of thermally and electrically good conductor such as copper or other metals. The diameter of the wire of the conductive material 11 is for example, 10 to 500 μm.

Next, as shown in a perspective partial view of FIG. 1B, an insulative substance such as a polyimide resin, a polybenzoxazole resin, an epoxy resin, and enamel is provided around the outer circumference of the conductive material 11, so that a conductive member 13 provided with an insulating coating material 12 (insulating material) can be obtained. The insulating coating material (insulating material) 12 is formed by heating so as to be cured after the insulative substance is applied. The insulating coating material 12 is formed so as to have a thickness of 1 to 100 μm after heating for curing. The curing is performed at a temperature required to cure the materials. In FIG. 1B, the conductive members 13 produced with the conductive material 11 having a cross-sectional shape of a circle (i) or a polygon (hexagon (ii), rectangle (iii), triangle (iv), etc.) as in FIG. 1A are shown, for example.

Next, as shown in a perspective partial view of FIG. 1C, a plurality of conductive members 13 are bound so that the cross sections of the plurality of conductive members 13 are densely filled to form a conductive member cluster 14. Here, the plurality of conductive members 13 are bundled and arranged in a grid or a staggered arrangement in cross-section. In FIG. 1C, a staggered arrangement is used to strength the binding. In FIG. 1C, the conductive member cluster 14 is formed with the conductive members 13 each of which includes the conductive material 11 having a cross-sectional shape of a circle.

Then, as shown in a perspective partial view of FIG. 1D, an insulative adhesive 15 is filled in the gaps in the bound and fixed conductive member cluster 14 for attachment, and is heated and cured to form a substrate block 16. The insulative adhesive 15 is made of an insulative substance such as a polyimide resin, a polybenzoxazole resin, an epoxy resin, and enamel. The curing of the insulative adhesive 15 is performed at a temperature required to cure the materials.

Then, as shown in a plan view of FIG. 1E, the substrate block 16 formed in the previous process is subjected to slicing processing so as to be cut, for example, along line B-B1 to form an anisotropic conductive original substrate 17 (substrate element). The slicing processing is performed at an arbitrary angle between 30° to 150° (typically 90°) with respect to the direction to which the conductive member 13 (or the conductive material 11) extends (longitudinal direction) such that the thickness becomes 0.05 mm to 3.00 mm (or 0.05 to 2.00 mm). In the slicing processing, the substrate block 16 is cut to a predetermined thickness with a slicing saw or a wire saw. The rough upper and lower surfaces (front surface and back face) of the sliced substrate are ground or polished so that they become smooth. There would be no problem if the rough surfaces are provided with a polished finish by, for example, polishing.

Then, as shown in a plan view of FIG. 1F, a plurality of upper bonding pads 18a, and a plurality of upper electrode pads 19a surrounding the upper bonding pads 18a are formed on the upper surface (front face) of the anisotropic conductive original substrate 17 whose upper and lower surfaces are smooth. Here, a pattern group including the plurality of bonding pads and electrode pads is arranged repeatedly at a predetermined interval on the entire surface of the anisotropic conductive original substrate 17. That is to say, the upper bonding pads 18a and the upper electrode pads 19a are formed for each region segmented to have a desired area corresponding to a single substrate unit. Although not shown in FIG. 1F, a plurality of lower bonding pads and a plurality of lower electrode pads surrounding the lower bonding pads are formed on the lower surface (back face) of the anisotropic conductive original substrate 17 in the portion corresponding to the respective pads arranged on the upper surface.

The patterns of the plurality of bonding pad, the electrode pads or the like are formed in the following manner. First, laminated films of Cu/Ni/Au are formed on the upper and the lower surfaces of the anisotropic conductive original substrate 17. Then, patterning is performed to this laminated film with a photomask provided with a predetermined pattern by photolithography so that the upper bonding pads 18a and the plurality of upper electrode pads 19a surrounding them, and the lower bonding pads and the plurality of lower electrode pads surrounding them are arranged. Thus, the patterns of the plurality of bonding pad, the electrode pads or the like are formed.

The laminated coating film of Cu/Ni/Au of this embodiment is a multilayered film in which a Cu layer, a Ni layer and a Au layer are laminated in this order from the bottom to have a thickness of 14 μm, 4 μm, and 0.5 μm, respectively. For this laminated metal coating film, in addition to the above-described materials, any other material can be used, as long as it is a thermally and electrically good conductor, and there is no limitation regarding the thickness. Photolithography is a technique in which a predetermined pattern is formed on a photoresist with a photomask, and pattern openings are etched by dry or wet etching so that the bonding pads and the electrode pads are formed.

Thus, a group of anisotropic conductive circuit boards having excellent electrical characteristics in which the upper surfaces of the circuit boards are connected to the lower surfaces in the shortest distance can be obtained. Finally, as shown in the plan view of FIG. 1G, the formed group of anisotropic conductive circuit boards is cut at a predetermined line with, for example, a dicing saw or a wire saw, so that an individually segmented single anisotropic conductive circuit board 20 can be obtained.

The obtained anisotropic conductive circuit board 20 include the conductive members constituted by the conductive materials 11 formed integrally from the upper surface through the lower surface and the insulating coating films 12 covering the outer circumferences of the conductive materials 11, and the insulative adhesive 15 for binding and fixing the plurality of conductive members 13 to each other. The upper bonding pad 18a and the plurality of upper electrode pads 19a are formed on the upper surface of the board 20, and the lower bonding pad and the plurality of lower electrode pads (terminal pads) constituting external terminals are formed on the lower surface of the board 20. With this structure, the conductive member 13 including the conductive material 11 can connect the upper surface to the lower surface of the board in the shortest distance, so that the electrical resistance and the inductance between the upper and the lower surfaces of the board can be reduced significantly. As a result, an anisotropic conductive circuit board having excellent electrical characteristics can be achieved.

In addition, the anisotropic conductive circuit board 20 of this embodiment is not provided with via holes, so that the problem that variations in the electrical resistance or the inductance in the circuit portion are caused by variations in the structure of the via holes or plating thickness in the via holes can be avoided. The electricity and moisture-resistance-related problem that the water content may enter the inside of a printed circuit board from the outside via the via holes, which corrodes the copper foils on the upper electrodes of the printed circuit board to which a connecting member such as a wire is connected also can be avoided. Furthermore, the conductive material 11 formed integrally from the upper surface through the lower surface of the board 20 is made of a substance that is not only electrically but also thermally good conductor, so that a thermal problem can be suppressed, compared to printed circuit boards made of glass epoxy having poor heat conductivity.

It should be noted that since the circuit board 20 of this embodiment is obtained by cutting the group of anisotropic conductive circuit boards shown in FIG. 1F at a predetermined line, the conductive member 13 and the insulative adhesive (insulative substance) 15 are exposed alternately on the side of the circuit board 20 of this embodiment, although this is not shown in FIG. 1G. In FIG. 1G, the circuit board 20 is a rectangle, but the shape of the circuit board 20 can be any one of a circle, a hexagon, and an octagon, in addition to a rectangle. Another layer (for example, an insulating layer) can be formed in a portion on the upper and the lower surface of the circuit board 20 in which the pads (18 and 19) are not positioned. Another layer (for example, an insulating layer) can be formed on the side surface of the circuit board 20.

Next, a semiconductor device and a method for producing the semiconductor device of this embodiment will be described with reference to FIGS. 2A to 2G.

Figure 2A:
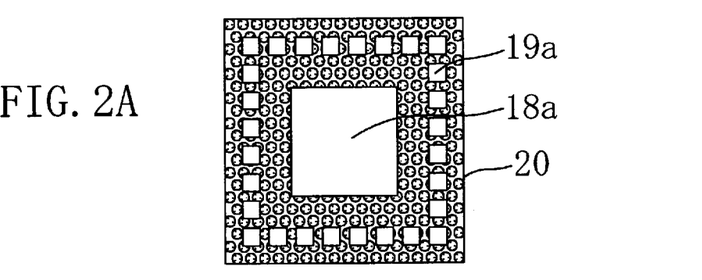
FIGS. 2A to 2G are views illustrating a semiconductor device of Embodiment 1 of the present invention and a method for producing the semiconductor device.
Figure 2B:
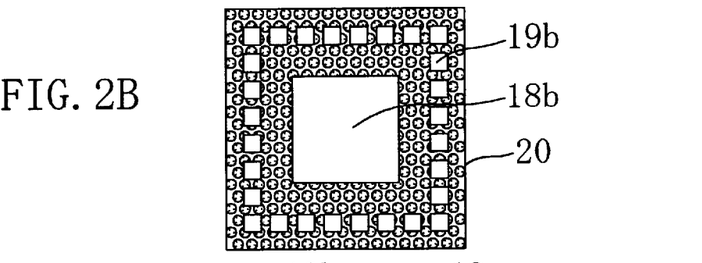
Figure 2C:
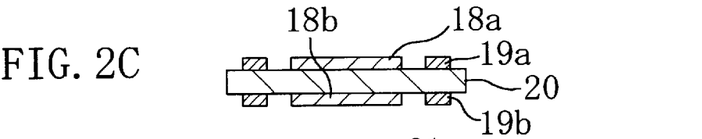

FIGS. 2A to 2G are views illustrating a semiconductor device and a method for producing the semiconductor device. FIGS. 2A to 2C are a plan view, a bottom view and a cross-sectional view of the circuit board 20 described above of this embodiment, respectively, and FIGS. 2D to 2G are cross-sectional views showing relevant processes in a production method of this embodiment.

First, as shown in FIGS. 2A to 2C, the anisotropic conductive circuit board 20 of this embodiment is prepared.

As described with reference to FIGS. 1A to 1G, the anisotropic conductive circuit board 20 of this embodiment includes the plurality of conductive members 13 and the insulative substance (insulative adhesive) 15 for binding and fixing the plurality of conductive members 13 to each other, and each of the conductive members 13 includes the conductive material 11 integrally formed from one end to the other end (i.e., from the upper surface through the lower surface of the substrate 20) and an insulating material 12 (insulating coating material) covering the outer circumference of the conductive material 11. In other words, the circuit board of this embodiment is constituted with conductive member clusters including the plurality of conductive members 13, each of which includes the conductive material 11 whose outer circumference is covered with the insulating coating material 12, and the insulative adhesive 15 for binding and fixing the plurality of conductive members 13. In the upper and the lower surfaces of the substrate 20, the upper bonding pad 18a made of a metal coating connected to each conductive member 13 of the conductive member cluster and the lower bonding pad 18b, and the upper electrode pads 19a connected to the conductive member of the conductive member cluster and the lower electrode pads 19b are provided, respectively. In FIGS. 2A to 2C, a single anisotropic conductive circuit board 20 is prepared, but in an actual production process, it is preferable to prepare a substrate in which a plurality of anisotropic conductive circuit boards 20 having the structure as shown in the drawings are arranged in a matrix and handle this substrate. This is preferable because if the substrate in which a plurality of anisotropic conductive circuit boards 20 are arranged is used, it is possible to produce a plurality of semiconductor devices of this embodiment in one process. However, as shown in FIGS. 2A to 2C, one anisotropic conductive circuit board 20 is prepared and then a semiconductor device may be produced with it.

Figure 2D:
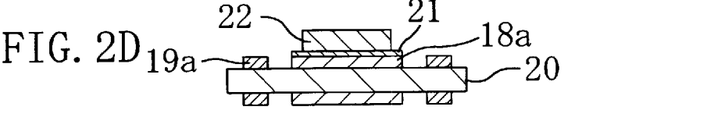

Next, as shown in FIG. 2D, a die bonding process is performed. First, a suitable amount of a conductive adhesive 21 such as Ag paste containing a mixture of an epoxy resin and Ag flakes is dripped for application onto the surface of the upper bonding pad 18a on the upper surface of the anisotropic conductive circuit board 20. Then, a semiconductor element 22 is mounted on the conductive adhesive 21 on the upper bonding pad 18a with the principal surface of the circuit upward. Therefore, heating is performed in a curing furnace at 100 to 250° C. in a nonoxidation atmosphere (e.g., nitrogen atmosphere) for one to two hours, so that the semiconductor element 22 is attached and fixed onto the upper bonding pad 18a with the conductive adhesive 21. In this case, solders can be used as the conductive adhesive 21, or when the curing temperature of the conductive adhesive 21 is low, heating can be performed in the air.

Figure 2E:
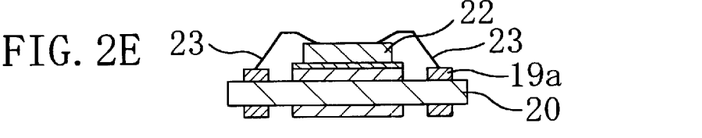

Then, as shown in FIG. 2E, a wire bonding process is performed. First, a plurality of electrode terminals (not shown) arranged in the principal surface of the semiconductor element 22 mounted on the board 20 are connected to the plurality of upper electrode pads 19a arranged in the periphery of the upper bonding pad on the upper surface of the anisotropic conductive circuit board 20 with connecting members 23 made of fine lines of Au, Cu, Al or the like, using a wire bonder. The diameter of the fine line is for example, 15 to 35 µm. Wire bonding is performed at a temperature between 150 to 250° C. under a necessary load for connection for a necessary period of time in a nitrogen atmosphere while applying ultrasonic vibrations. However, if the temperature is 200° C. or less, wire bonding can be performed in the air. In this embodiment, metal fine lines are used as the connecting member 23, but metal ribbons can be used as well.

Figure 2F:
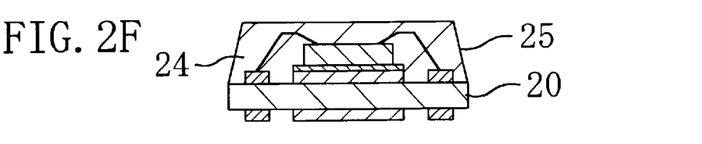

Then, as shown in FIG. 2F, a resin sealing process is performed. More specifically, the wire-bonded anisotropic conductive circuit board 20 is set in a resin sealing mold, and then a transfer resin sealing is performed in which a melted epoxy resin is pored into the mold cavity from a gate port of the resin sealing mold, so that a sealing resin 24 is formed on the upper surface of the board. Here, the surface temperature of the resin sealing mold for molding is 170 to 190° C., and the mold cavity can be such that the entire upper surface of the anisotropic conductive circuit board 20 is covered. Thus, a semiconductor device 25 having the anisotropic conductive circuit board 20 of this embodiment is obtained.

Figure 2G:
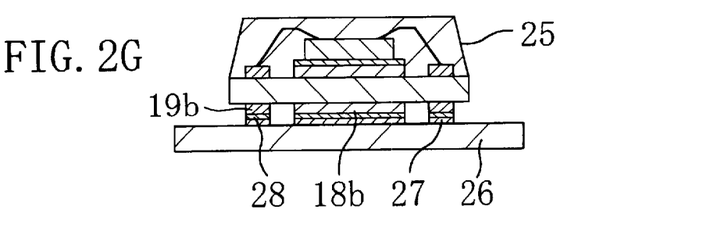

Thereafter, as shown in FIG. 2G, a secondary mounting process may be performed in which the semiconductor device is mounted on a mounting circuit board (mounting substrate) such as a mother board. The semiconductor device 25 have the lower bonding pad 18b and the lower electrode pads 19b on the lower surface of the board 20 attached and fixed to the semiconductor element 22, and therefore the semiconductor device 25 can be fixed on a predetermined position of a mounting circuit board 26 in the following manner: The lower bonding pad 18b and the lower electrode pads 19b provided in the board 20 of the semiconductor device are arranged so as to correspond to the portions in which solder paste 28 is printed by a solder printing technique in the region on the circuit terminals 27 provided on the mounting circuit board 26. Thereafter, the solder paste 28 is melted in a reflow furnace. Thus, a mounted structure in which the secondary mounting is completed can be obtained.

As describe above, the semiconductor device 25 including the anisotropic conductive circuit board 20, the semiconductor element 22 mounted on the upper surface of the anisotropic conductive circuit board 20, the connecting members 23 electrically connecting the electrode terminals of the semiconductor element 22 and the upper electrode pads 19a exposed on the upper surface of the anisotropic conductive circuit board 20, and the sealing resin 24 sealing the periphery of the semiconductor element 22 on the upper surface of the anisotropic conductive circuit board 20 and the connecting members 23 can be achieved. The semiconductor device 25 of this embodiment constitutes a package by utilizing the above-described anisotropic conductive circuit board 20 as the circuit board, unlike a conventional LGA (or BGA) type package employing a printed circuit board, and therefore the semiconductor device is electrically, moisture-resistantly and thermally excellent.

In other words, the semiconductor device of this embodiment of the present invention includes, as a component, the anisotropic conductive circuit board obtained by bundling a plurality of conductive members, each of which includes a fine line-like conductive material covered with an insulating material, to form a block with an insulative adhesive and slicing the block. Therefore, the electrical resistance and the inductance between the upper and the lower surfaces of the board are significantly small, and an electrically excellent semiconductor device can be achieved. Furthermore, since the board itself does not include via holes, unlike conventional boards, so that water hardly goes into the upper surface of the board, and therefore a semiconductor device having high reliability can be achieved. In addition, since the board is made of a good conductor, the heat release properties to the secondary mounting substrate are improved significantly, so that a semiconductor device that is electrically, moisture-resistantly and thermally excellent can be provided.

Furthermore, in the method for producing the semiconductor device of this embodiment of the present invention, a plurality of conductive members, each of which includes a fine line-like conductive material covered with an insulating coating are bundled to form a block with an insulative adhesive and the block is sliced to form an anisotropic conductive circuit board, and a semiconductor device is produced, using that board. Therefore, a semiconductor device that is electrically, moisture-resistantly and thermally excellent can be produced.

Embodiment 2

Figure 3:
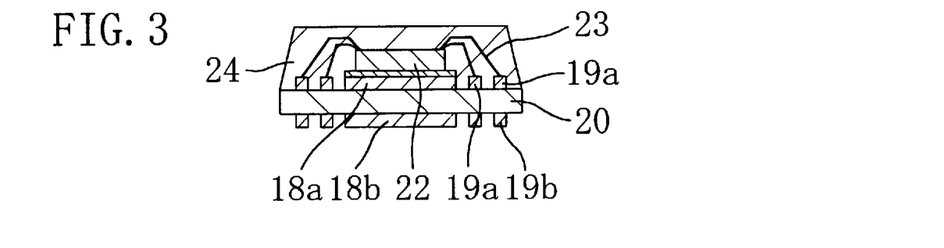
FIG. 3 is a cross-sectional view schematically showing a semiconductor device of Embodiment 2 of the present invention.

Embodiment 2 of the present invention will be described with reference to FIGS. 3 to 5. FIG. 3 is a schematic view showing the structure of the semiconductor device of Embodiment 2.

The semiconductor device of this embodiment shown in FIG. 3 is different from the semiconductor device of Embodiment 1 in that a plurality of rows (two rows) of lower electrode pads 19b are aligned. Other aspects are the same as in Embodiment 1. For the sake of simplification of description, in this embodiment and the following embodiments, different aspects from those of Embodiment 1 are mainly described and other aspects will be omitted or simplified.

The semiconductor device shown in FIG. 3 includes an anisotropic conductive circuit board 20 including an upper bonding pad 18a, a lower bonding pad 18b, a plurality of upper electrode pads 19a and a plurality of lower electrode pads 19b that are aligned in a plurality of rows (two rows) on the upper and the lower surfaces thereof, a semiconductor element 22 mounted on the upper surface of the anisotropic conductive circuit board 20 with a conductive adhesive, connecting members 23 for electrically connecting the electrode terminals of the semiconductor element 22 and the upper electrode pad 19a exposed on the upper surface of the anisotropic conductive circuit board 20, and a sealing resin 24 for sealing the periphery of the semiconductor element 22 on the anisotropic conductive circuit board 20 and the connecting members 23.

Figure 4A:
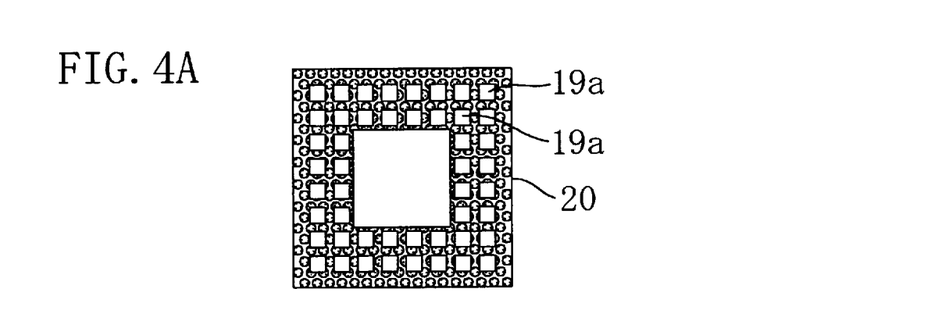
FIGS. 4A to 4C are views illustrating a printed circuit board of the semiconductor device of Embodiment 2 of the present invention.
Figure 4B:
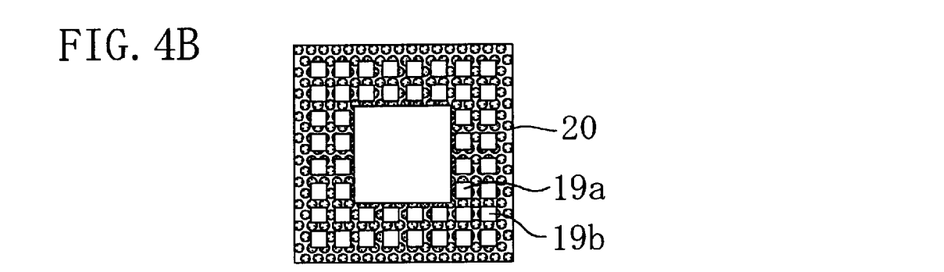
Figure 4C:
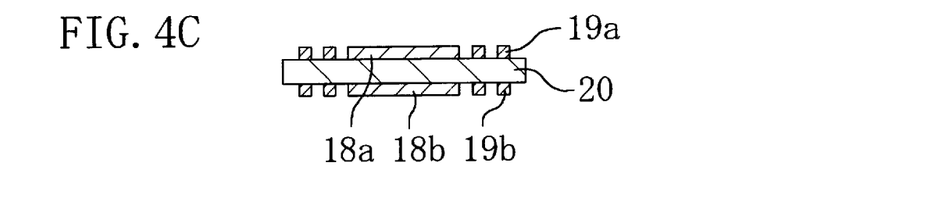

In the semiconductor device of this embodiment, as shown in FIGS. 4A to 4C, a plurality of rows of the upper electrode pads 19a and lower electrode pads 19b are provided, instead of the one row structure shown in FIGS. 2A to 2G, on the anisotropic conductive circuit board 20. This semiconductor can be produced in the same manner as in Embodiment 1, except for forming an increased number of terminals.

Figure 5:
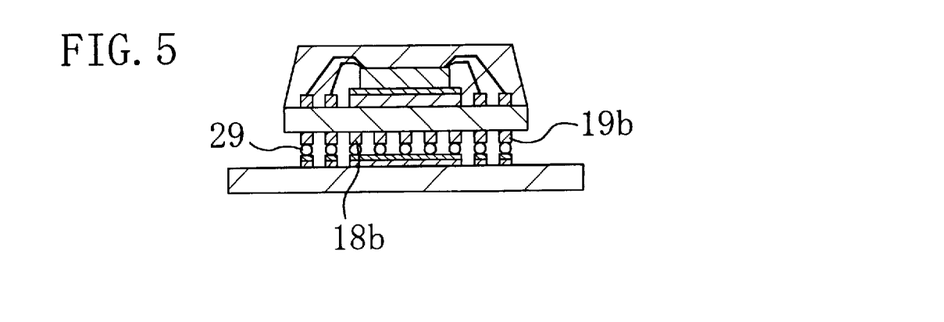
FIG. 5 is a view showing the substrate mounting state of the semiconductor device of Embodiment 2 of the present invention.

As shown in FIG. 5, a BGA type semiconductor device can be achieved by providing ball electrodes 29 such as metal solder balls to the upper bonding pad 18b and the lower electrode pads 19b on the anisotropic conductive circuit board 20. FIG. 5 shows the state where the ball the semiconductor device is mounted on the mounting substrate via the ball electrodes.

Embodiment 3

Figure 6:
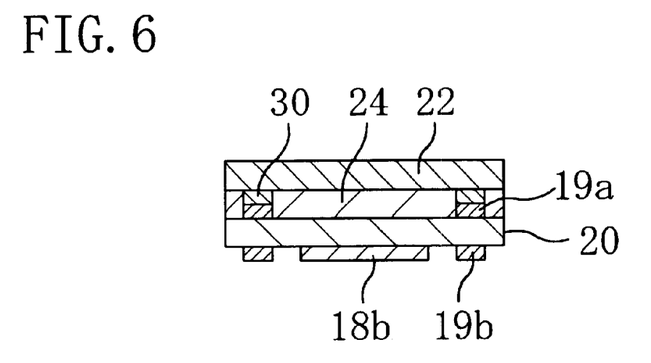
FIG. 6 is a cross-sectional view schematically showing a semiconductor device of Embodiment 3 of the present invention.

Next, Embodiment 3 will be described with reference to FIG. 6. FIG. 6 is a schematic view showing the cross-sectional structure of a semiconductor device of Embodiment 3.

The semiconductor device shown in FIG. 6 includes an anisotropic conductive circuit board 20 including a lower bonding pad 18b, a plurality of upper electrode pads 19a and lower electrode pads 19b on the upper and the lower surfaces thereof, a semiconductor element 22 mounted on the upper surface of the anisotropic conductive circuit board 20 with a conductive adhesive by flip-chip mounting, protruding electrodes 30 that are connecting members for electrically connecting the electrode terminals of the semiconductor element 22 and the upper electrode pad 19a. Furthermore, a sealing resin 24 (underfill material) seals the gap between the upper surface of the anisotropic conductive circuit board 20 and the semiconductor element 22.

The semiconductor device of this embodiment has a flip-chip mounting structure in which the semiconductor element is mounted on the substrate such that the principal surface side in which a circuit is formed is opposed to the substrate, and is connected to the substrate with the protruding electrodes without using metal fine lines as the connecting members, so that a CSP (chip size package) type semiconductor device having the same size for the substrate and the semiconductor element can be realized. In the production of this type of semiconductor device, it is not necessary to provide the upper bonding pads on the upper surface of the anisotropic conductive circuit board to be used.

Embodiment 4

Figure 7:
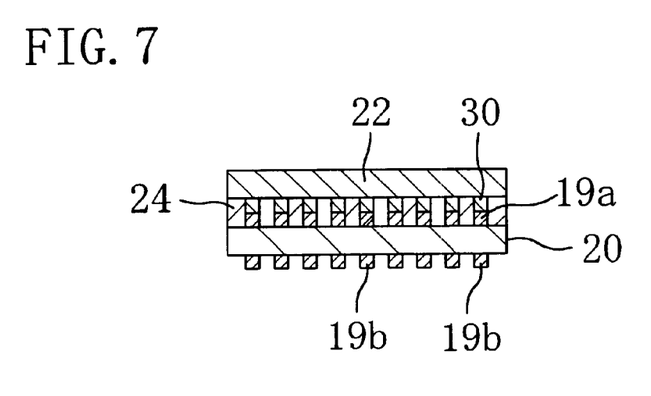
FIG. 7 is a cross-sectional view schematically showing a semiconductor device of Embodiment 4 of the present invention.

Next, Embodiment 4 will be described with reference to FIG. 7. FIG. 7 is a schematic view showing the cross-sectional structure of a semiconductor device of Embodiment 4.

The semiconductor device shown in FIG. 7 includes an anisotropic conductive circuit board 20 including a plurality of upper electrode pads 19a and lower electrode pads 19b on the upper and the lower surfaces thereof, a semiconductor element 22 mounted on the upper surface of the anisotropic conductive circuit board 20 with a conductive adhesive by flip-chip mounting, protruding electrodes 30 (bump electrodes) that are connecting members for electrically connecting the electrode terminals of the semiconductor element 22 and the upper corresponding electrode pad 19a, and a sealing resin 24 (underfill material) for sealing the gap between the upper surface of the anisotropic conductive circuit board 20 and the semiconductor element 22.

The semiconductor device of this embodiment has a flip-chip mounting structure in which the semiconductor element is mounted on the substrate such that the principal surface side in which a circuit is formed is opposed to the substrate, and is connected to the substrate with the protruding electrodes without using metal fine lines as the connecting members, so that a CSP (chip size package) type semiconductor device having the same size for the substrate and the semiconductor element can be realized. In the production of this type of semiconductor device, it is not necessary to provide the bonding pads for mounting the semiconductor device on the upper and the lower surfaces of the anisotropic conductive circuit board to be used.

Furthermore, in the semiconductor device shown in FIG. 7, an area array pad type of semiconductor element in which electrode terminals are formed in an array manner on the principal surface of the semiconductor element 22 is used as the semiconductor element 22 to be mounted. Also for the semiconductor device of this embodiment, a CSP structure can be realized as for the semiconductor device shown in FIG. 6.

In both the semiconductor devices shown in FIGS. 6 and 7, there would be no problem if ball elements are provided on the lower electrode pads on the lower surface of the board to constitute a BGA type semiconductor device.

The semiconductor devices of the above-described embodiments includes, as a component, an anisotropic conductive circuit board obtained by bundling a plurality of conductive members including fine line-like conductive materials covered with insulating coating to forms a block with an insulative adhesive, and slicing the block. Therefore, the electrical resistance and the inductance between the upper and the lower surfaces of the board are significantly small. Furthermore, since the board itself does not include via holes, unlike conventional boards, so that water hardly goes into the upper surface of the board, and therefore a semiconductor device having high reliability can be achieved. In addition, since the board is made of a good conductor, the heat release properties to a secondary mounting substrate are improved significantly, so that a semiconductor device that is electrically, moisture-resistantly and thermally excellent can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:

a circuit board;

a semiconductor element that is mounted on an upper surface of the circuit board and has an electrode terminal;

a sealing resin for sealing a periphery of the semiconductor element that is mounted on the upper surface of the circuit board, wherein the circuit board includes a plurality of conductive members and an insulating substance for binding and fixing the plurality of conductive members to each other, and each of the plurality of conductive members includes a conductive material formed integrally from the upper surface through the lower surface of the circuit board, and an insulating material covering an outer circumference of the conductive material, the conductive material of at least one conductive member of the plurality of conductive members is exposed to the upper surface of the circuit board; and the electrode terminal of the semiconductor element is electrically connected to the conductive material of the conductive member exposed to the upper surface of the circuit board via a connecting member.

2. The semiconductor device according to claim 1, wherein a bonding pad made of a metal coating film connected to the conductive material of a part of the plurality of conductive members, and an electrode pad connected to the conductive material of a part of the plurality of conductive members are provided on the upper surface of the circuit board, the semiconductor element is mounted on the bonding pad, the electrode terminal of the semiconductor element is connected to the electrode pad via the connecting member, a lower electrode pad corresponding to the electrode pad on the upper surface is provided on a lower surface of the circuit board; and the lower electrode pad is connected to the conductive material of the conductive member connected to the electrode pad provided on the upper surface.

3. The semiconductor device according to claim 1, wherein the conductive material of at least one conductive member of the plurality of conductive members is exposed to the lower surface of the circuit board, and a ball electrode or a protruding electrode is connected to the conductive material of the conductive member exposed to the lower surface of the circuit board.

4. The semiconductor device according to claim 1, wherein the conductive material is a fine line-like conductive material.

5. The semiconductor device according to claim 1, wherein the conductive material has a cross-sectional shape of a circle or a polygon.

6. The semiconductor device according to claim 1, wherein the conductive member and the insulating substance are exposed alternately to a side surface of the circuit board.

7. The semiconductor device according to claim 1, wherein the circuit board is an anisotropic conductive circuit board that has electrical conductivity with respect to the upper and the lower surfaces and is electrically insulated in a horizontal direction.

8. The semiconductor device according to claim 1, wherein a shape of the circuit board viewed from the upper surface thereof is any one of a circle, a rectangle, a hexagon and an octagon.

9. The semiconductor device according to claim 1, wherein the connecting member is a conductive metal fine line or a metal ribbon.

10. The semiconductor device according to claim 1, wherein the connecting member is a conductive protruding electrode.

* * * * *